United States Patent
Moriwaki

(10) Patent No.: US 7,781,815 B2
(45) Date of Patent: Aug. 24, 2010

(54) THIN-FILM ELEMENT, DISPLAY DEVICE AND MEMORY CELL USING THE THIN-FILM ELEMENT, AND THEIR FABRICATION METHODS

(75) Inventor: Hiroyuki Moriwaki, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 313 days.

(21) Appl. No.: 11/915,171

(22) PCT Filed: Jun. 15, 2006

(86) PCT No.: PCT/JP2006/312071

§ 371 (c)(1),
(2), (4) Date: Nov. 21, 2007

(87) PCT Pub. No.: WO2007/029394

PCT Pub. Date: Mar. 15, 2007

(65) Prior Publication Data

US 2009/0090910 A1    Apr. 9, 2009

(30) Foreign Application Priority Data

Sep. 9, 2005   (JP) .............................. 2005-263058

(51) Int. Cl.
*H01L 27/108* (2006.01)
(52) U.S. Cl. ................. 257/296; 438/138; 257/E21.35; 257/E27.151; 257/E29.343
(58) Field of Classification Search ................. 257/301, 257/303–306, 296, E21.008, E21.35, E27.048, 257/E29.151, E29.343; 438/239, 243, 253, 438/149, 381
See application file for complete search history.

(56) References Cited

U.S. PATENT DOCUMENTS

| 5,299,155 A | 3/1994 | Yanagi |
| 7,436,647 B2 * | 10/2008 | Koiwa et al. ................. 361/303 |
| 2005/0110068 A1 | 5/2005 | Hino et al. |

FOREIGN PATENT DOCUMENTS

| CN | 1485655 A | 3/2004 |
| JP | 61-264740 A | 11/1986 |
| JP | 11-054759 | 2/1999 |
| JP | 2004-158598 | 6/2004 |

OTHER PUBLICATIONS

International Search Report for PCT/JP2006/312071 mailed Sep. 19, 2006.

* cited by examiner

*Primary Examiner*—Quoc D Hoang
(74) *Attorney, Agent, or Firm*—Nixon & Vanderhye P.C.

(57) ABSTRACT

Pixel auxiliary capacitors (10) and pixel TFTs, which are thin-film elements, are formed on a substrate a lower electrode (Si) (3), insulating film, and an upper electrode (GE) (5) in this order. Each upper electrode (GE) (5) opposing to the corresponding lower electrode (Si) (3) is entirely enclosed within the outline of the lower electrode (Si) (3) in a plane view. Thus, it is possible to provide thin-film elements, which are not affected by edges of the lower electrode (Si) (3), a display device and a memory cell using the thin-film elements, and their fabrication methods.

24 Claims, 16 Drawing Sheets

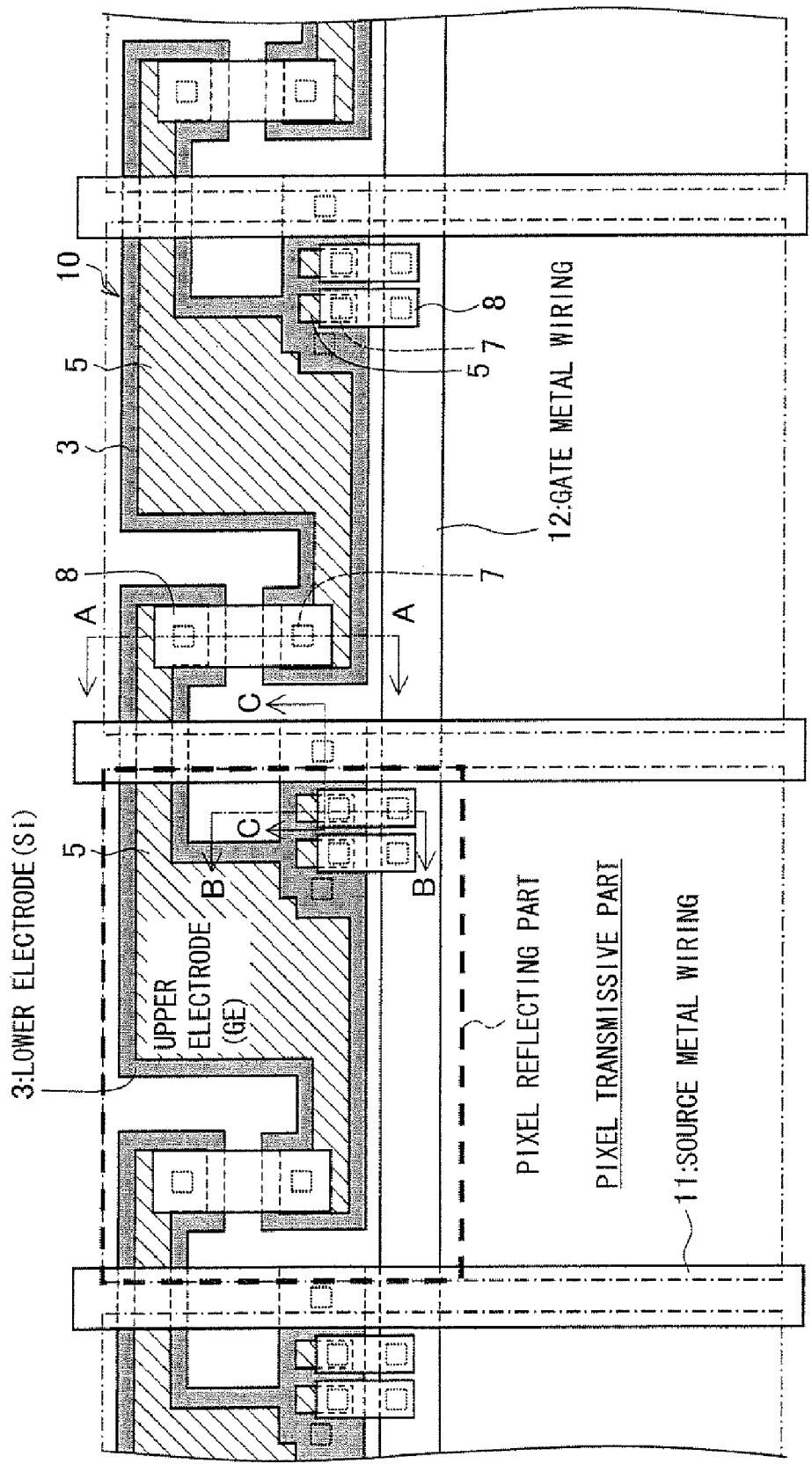

F I G. 2
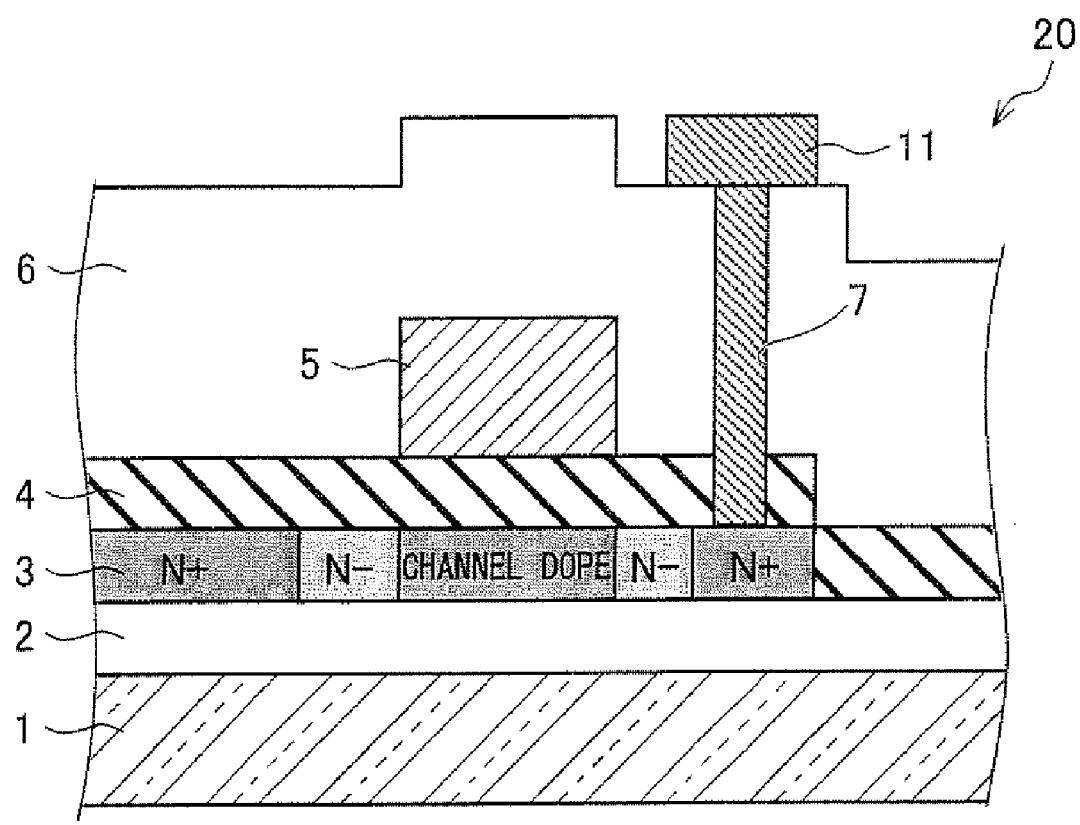

F I G. 6 (a)
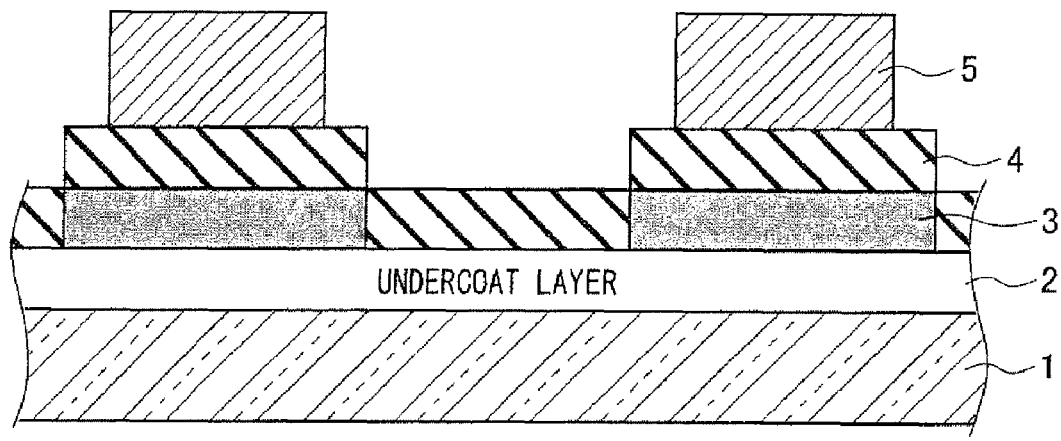
F I G. 6 (b)
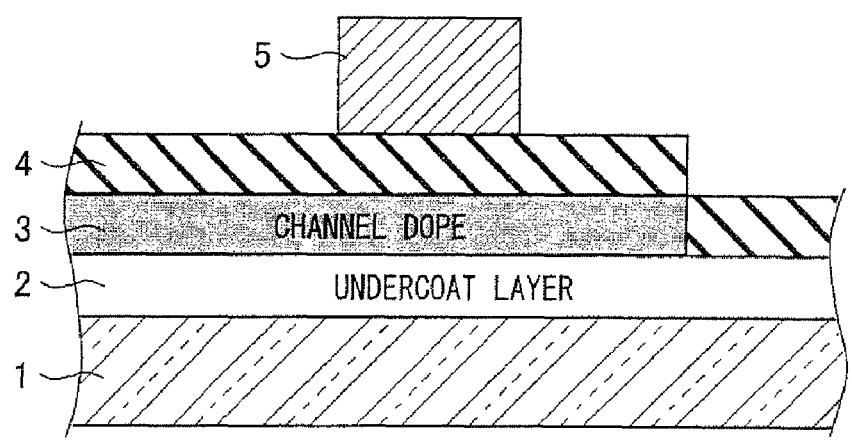

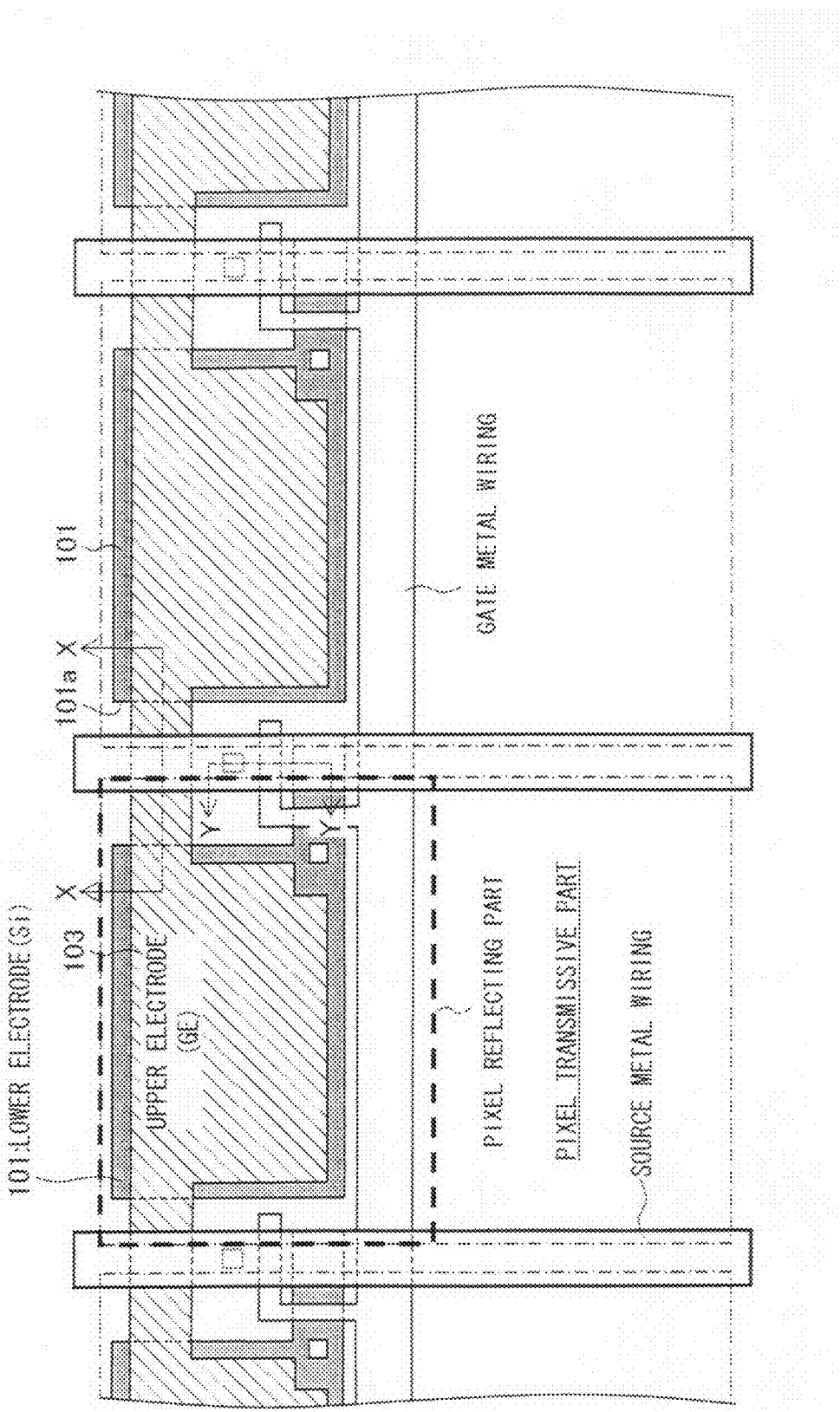

FIG. 13 (a) (Prior Art)
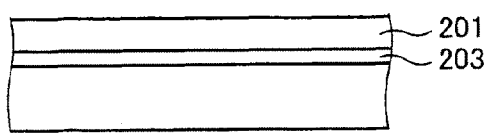
FIG. 13 (e) (Prior Art)
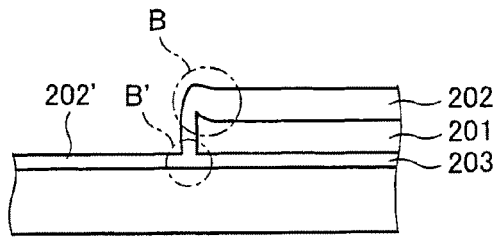
FIG. 13 (b) (Prior Art)
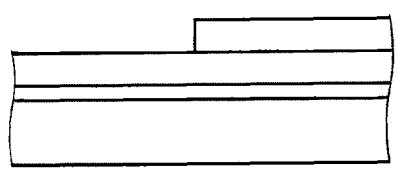
FIG. 13 (f) (Prior Art)
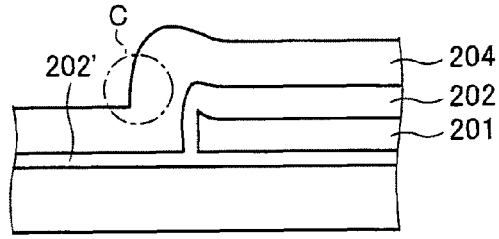
FIG. 13 (c) (Prior Art)
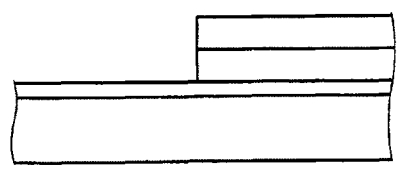
FIG. 13 (g) (Prior Art)
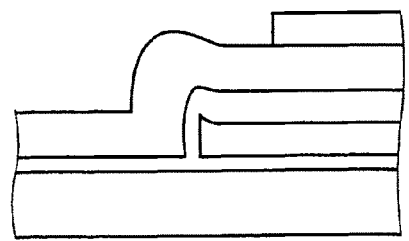
FIG. 13 (d) (Prior Art)
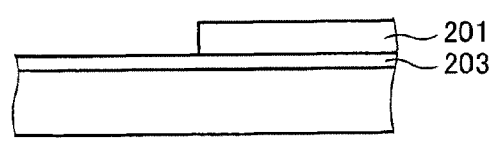
FIG. 13 (h) (Prior Art)
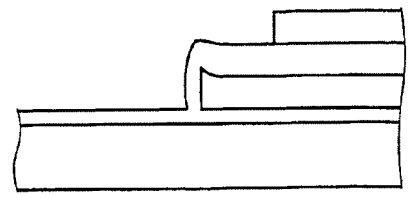

THIN-FILM ELEMENT, DISPLAY DEVICE AND MEMORY CELL USING THE THIN-FILM ELEMENT, AND THEIR FABRICATION METHODS

This application is the U.S. national phase of International Application No. PCT/JP2006/312071 filed 15 Jun. 2006 which designated the U.S. and claims priority to Japanese Application No. 2005-263058 filed 9 Sep. 2005, the entire contents of each of which are hereby incorporated by reference.

TECHNICAL FIELD

The present invention relates to a plurality of thin-film elements including a lower electrode, an insulating layer, and an upper electrode formed on a substrate, and a display device and a memory cell using the thin-elements, and their fabrication methods.

BACKGROUND ART

As illustrated in FIGS. 11 (a) and 11 (b), a conventional liquid crystal display device uses a lot of thin-film elements, each of which includes, on a substrate, a lower electrode 101, an insulating layer 102, and an upper electrode 103. The thin-film elements are used as a pixel auxiliary capacitor 101. At the same time, a pixel TFT (Thin-film Transistor) also uses such a thin-film element including a lower electrode 101, an insulating layer 102, and an upper electrode 103 as illustrated in FIG. 11(a) and FIG. 11 (c).

The thin-film elements of such configuration are provided not only in the liquid crystal display device, but also in a data storing memory cell. For example, Japanese Unexamined Patent Application Publication No. 4-274359 (published on Sep. 30, 1992)(hereinafter, referred to as Patent Document 1) discloses, as illustrated in FIG. 12, a configuration including a lower capacitor electrode 151, which acts as a lower electrode, an insulating layer, which is not illustrated in the figure, and an upper capacitor 152, which acts as an upper electrode.

Incidentally, in the case where the thin-film element including the lower electrode 101, the insulating layer 102, the upper electrode 103 is formed as illustrated in FIGS. 11(a) and 11(b), the upper electrode 103 cannot be drawn over a same layer without being extended over an edge of the lower electrode 101.

As a result, a part of the upper electrode 103 is raised at an edge 101a of the lower electrode 101. Thereby, the insulating layer 102 does not efficiently cover the edge 101a of the lower electrode 101, then breakdown voltage falls. As a result, in a high-voltage charged capacitor, leakage is caused at the upper electrode 103 and the upper electrode 101 by dielectric breakdown.

Japanese Unexamined Patent Application Publication No. 61-264740 (published on 22 Nov., 1986)(hereinafter, referred to as Patent Document 2) also concretely discloses this issue. FIGS. 13(a) to 13 (h) illustrate a conventional fabrication process, which is disclosed in Patent Document 2.

That is, Patent Document 2 discloses that, as illustrated in FIG. 13 (e), effects of inner distortion caused by heat stress etc. tend to cause projection at edge portions (B) of a vertically etched first layer polysilicon gate electrode 201 and a second gate oxide film 202 formed by heat oxidization on the first layer polysilicon gate electrode 201, while the second gate oxide film 202 (B') tends to be extremely thinned near a first gate oxide film 203 by the same effects.

Moreover, FIG. 13 (f) illustrates a step for forming a second layer polysilicon gate electrode 204 on the second gate oxide film 202-202': firstly forming about 3000A of a second layer polysilicon film by an LPCVD technique and then diffusing phosphorus on the second layer polysilicon film. In this step, an edge of the second layer polysilicon gate electrode 204 is overhung (i.e., having a portion (C)) by effects of the projected peripheral part (B) and the thinner part (B') illustrated in FIG. 13(e). As a result, enough breakdown voltage cannot be attained between the first layer polysilicon gate electrode 201 and the second layer polysilicon gate electrode 204. Exceeding the breakdown voltage causes leakage between the first layer polysilicon gate electrode 201 and the second layer polysilicon gate electrode 204.

Patent Document 2 discloses a solution for the issue. As illustrated in FIGS. 14 (a) to 14 (h), the edge of the first layer polysilicon gate electrode 201 is etched in a tapered shape, whereby the second gate oxide film 202 will not have an overhung shape and also have a smoother surface. As a result, the first layer polysilicon gate electrode 201 is covered sufficiently. Thereby, it is possible to obtain enough breakdown voltage in between the first layer polysilicon gate electrode 201 and the second layer polysilicon gate electrode 204.

However, when fabricating a TFT with the conventional thin-film elements, in which the first layer polysilicon gate electrode 201 as a lower electrode is formed with the tapered edge as disclosed in Patent Document 2, a different issue is caused. That is, a difference in thickness between a central part and an edge of the lower electrode causes a difference in dope concentration in the lower electrode. As a result, a threshold property of the TFT becomes different between the central part of the lower electrode and the edge of the lower electrode, and then the edge acts as a parasitic transistor, thereby deteriorating the TFT in property.

DISCLOSURE OF INVENTION

The present invention is accomplished in view of the conventional problems. An object of the present invention is to provide thin-film elements that are not affected by a lower electrode, a display device and a memory cell using the thin-film elements, and their fabrication methods.

In order to attain the object, a plurality of the thin-film elements of the present invention, each of which includes a lower electrode, a first insulating layer, and an upper electrode, in this order, on a substrate, is arranged such that each upper electrode opposing to the corresponding lower electrode is entirely enclosed within an outline of the lower electrode in a plane view.

In order to attain the object, a fabrication method of the present invention for fabricating the thin-film elements of the present invention is a method including the steps of: forming a lower electrode on a substrate; forming a first insulating layer on the lower electrode; and forming an upper electrode above the insulating layer, so that the upper electrode is enclosed within the outline of the lower electrode in a plane view.

According to the present invention, each upper electrode opposing to the corresponding lower electrode is entirely enclosed within an outline of the lower electrode in a plane view. As a result, the upper electrode does not extend across the lower electrode. Thereby, the upper electrode is not affected by the edge of the lower electrode. As a result, leakage, which is caused by exceeding the breakdown voltage, is not caused at the edge of the lower electrode. Furthermore, in a TFT (Thin film Transistor) using the thin-film elements, the parasitic transistor and the difference in the threshold property are prevented.

Thereby it is possible to provide the thin-film elements, which are not affected by the edge of the lower electrode, and their fabrication method.

In the thin-film elements of the present invention, it is preferable that a second insulating layer is formed on the upper electrode and a wiring layer be formed on the second insulating layer. It is also preferable that the upper electrode and the wiring layer be electrically connected to each other through a contact hole formed in the second insulating layer.

Furthermore, the fabrication method of the thin-film elements of the present invention preferably includes the steps of forming the second insulating layer on the upper electrode; forming the contact hole in the second insulating layer; and forming the wiring layer electrically connected to the upper electrode through the contact hole.

According to the present invention, it is possible to connect the upper electrode to outside through the wiring layer connected to the upper electrode through the contact hole. Thus, in the pixel auxiliary capacitor described later, it is possible to electrically connect each upper electrode to each other. On the other hand, in the pixel thin film transistor described later, it is possible, for example, to connect the upper electrode, which acts as a gate electrode, to the wiring layer, which acts as a gate wiring.

A conventional upper electrode is formed by connecting a plurality of thin-film elements, with each other. Thus a large amount of electric charge is accumulated on the upper electrode during manufacturing. As a result, in the case where the electric charge is locally accumulated intensively, huge electric intensity will be generated in between the upper electrode and the lower electrode. Thereby, the thin-film elements are sometimes broken down by static electricity.

In contrast, in the present invention, each of upper electrodes is independently separated from each other, thus the electric charge between each upper electrode and its corresponding lower electrode is smaller. Thus, electric charge is not accumulated easily on the upper electrode and the wiring layer. As a result, electrostatic will be prevented.

A display device of the present invention uses, in order to attain the object, the thin-film elements as pixel auxiliary capacitors.

In order to attain the object, a fabrication method according to the present invention for producing a display device is a method, arranged such that the fabrication method for fabricating the thin-film element is used for fabrication of a pixel auxiliary capacitor. Thus, it is possible to provide the display device, which is not affected by the edge of the lower electrode, and its fabrication method.

In addition, the display device of the present invention uses, in order to attain the object, the thin-film elements as thin film transistors.

Furthermore, in order to attain the object, a fabrication method according to the present invention for producing a display device is a method arranged such that the fabrication method for fabricating the thin-film element is used for fabrication of a thin film transistor.

Thus, it is possible to provide the display device, which is not affected by the edge of the lower electrode, and its fabrication method.

In addition, a display device of the present invention uses, in order to attain the object, the thin-film elements as pixel auxiliary capacitors and thin film transistors.

Furthermore, in order to attain the object, a fabrication method according to the present invention for producing a display device is a method arranged such that the fabrication method for fabricating the thin-film element is used for fabrication of a thin film transistor and a thin film transistor.

Thus it is possible to provide the display device, which is not affected by the edge of the lower electrode, and its fabrication method.

In addition, in the display device of the present invention, it is preferable that the wiring layer act as a sauce wiring layer.

This allows to apply a conventional fabrication step to form the wiring layer. That is, it is not necessary to have an additional step.

In addition, a memory cell of the present invention uses, the thin-film elements as data storing capacitors.

Furthermore, according to the present invention, a fabrication method for producing the memory cell, the method is, in order to attain the object, arranged such that the fabrication method for fabricating the thin-film element is used for fabrication of a data storing capacitor.

Thus, it is possible to provide the memory cell, which is not affected by the edge of the lower electrode, and its fabrication method.

For a fuller understanding of the nature and advantages of the invention, reference should be made to the ensuing detailed description taken in conjunction with the accompanying drawings.

BRIEF DESCRIPTION OF DRAWINGS

FIG. 1 (b) is a cross-sectional view taken from line A-A of FIG. 1 (a) illustrating a configuration of the pixel auxiliary capacitor on the liquid crystal panel substrate.

FIG. 1 (c) is a cross-sectional view taken from line B-B of FIG. 1 (a) illustrating a configuration of the TFT on the liquid crystal panel substrate.

FIG. 2 is a cross-sectional view taken from line C-C of FIG. 1 (a) illustrating a configuration of the TFT on the liquid crystal panel substrate in the liquid crystal display device.

FIG. 3(a) illustrates a forming step of a lower electrode (Si) in a pixel auxiliary capacitor in the fabrication process.

FIG. 3 (b) is a cross-sectional view illustrating the fabrication process of the liquid crystal display device. FIG. 3(b) illustrates a forming step of an upper electrode (Si) in the pixel TFT in the fabrication process.

FIG. 4 (a) illustrates a forming step of an insulating layer (GI) in the pixel auxiliary capacitor in the fabrication process.

FIG. 4 (b) is a cross-sectional view illustrating a forming step of the insulating layer (GI) on the pixel TFT.

FIG. 5 (a) illustrates a step channel doping step in the pixel auxiliary capacitor in the fabrication process.

FIG. 5 (b) is a cross-sectional view illustrating the channel doping step in the pixel TFT.

FIG. 6 (a) is a cross-sectional view illustrating the fabrication process of the liquid crystal display device. FIG. 6 (a) illustrates a forming step of the upper electrode (GE) in the pixel auxiliary capacitor in the fabrication process.

FIG. 6 (b) is a cross-sectional view illustrating a forming step of the upper electrode (GE) in the pixel TFT.

FIG. 7 (a) illustrates a forming step of a source and a drain regions in the pixel TFT in the fabrication process.

FIG. 7 (b) is a cross-sectional view illustrating a forming step of the source and drain regions in the pixel TFT.

FIG. 8 (a) illustrates a forming step of an interlayer dielectric in the pixel auxiliary capacitor in the fabrication process.

FIG. 8 (b) is a cross-sectional view illustrating a forming step of the interlayer dielectric in the pixel TFT.

FIG. 9 (a) illustrates a forming step of a contact hole in the pixel auxiliary capacitor in the fabrication process.

FIG. 9 (b) is a cross-sectional view illustrating a forming step of a contact hole in the pixel TFT.

FIG. 10 (a) illustrates a forming step of a source metal wiring in the pixel auxiliary capacitor in the fabrication process.

FIG. 10 (b) is a cross-sectional view illustrating a forming step of the source metal wiring in the pixel TFT.

FIG. 11 (b) is a cross-sectional view taken from line X-X of FIG. 11 (a) illustrating a configuration of the pixel auxiliary capacitor on the liquid crystal panel substrate.

FIG. 11 (c) is a cross-sectional view taken from line Y-Y of FIG. 11 (a) illustrating a configuration of the TFT on the liquid crystal panel substrate.

FIG. 13 (a) is a cross-sectional view illustrating a step in fabrication of a conventional semiconductor device.

FIG. 13 (b) is a cross-sectional view illustrating a step in the fabrication of the conventional semiconductor device, which step is next to the step illustrated in FIG. 13 (a).

FIG. 13 (c) is a cross-sectional view illustrating a step in the fabrication of the conventional semiconductor device, which step is next to the step illustrated in FIG. 13 (b).

FIG. 13 (d) is a cross-sectional view illustrating a step in the fabrication of the conventional semiconductor device, which step is next to the step illustrated in FIG. 13 (c).

FIG. 13 (e) is a cross-sectional view illustrating a step in the fabrication of the conventional semiconductor device, which step is next to the step illustrated in FIG. 13 (d).

FIG. 13 (f) is a cross-sectional view illustrating a step in the fabrication of the conventional semiconductor device, which step is next to the step illustrated in FIG. 13 (e).

FIG. 13 (g) is a cross-sectional view illustrating a step in the fabrication of the conventional semiconductor device, which step is next to the step illustrated in FIG. 13 (f).

FIG. 13 (h) is a cross-sectional view illustrating a step in the fabrication of the conventional semiconductor device, which step is next to the step illustrated in FIG. 13 (g).

FIG. 14 (b) is a cross-sectional view illustrating a step in the another fabrication of the second conventional semiconductor device, which step is next to the step illustrated in FIG. 14 (a).

FIG. 14 (c) is a cross-sectional view illustrating a step in the another fabrication of the second conventional semiconductor device, which step is next to the step illustrated in FIG. 14 (b).

FIG. 14 (d) is a cross-sectional view illustrating a step in the another fabrication of the second conventional semiconductor device, which step is next to the step illustrated in FIG. 14 (c).

FIG. 14 (e) is a cross-sectional view illustrating a step in the another fabrication of the second conventional semiconductor device, which step is next to the step illustrated in FIG. 14 (d).

FIG. 14 (f) is a cross-sectional view illustrating a step in the another fabrication of the second conventional semiconductor device, which step is next to the step illustrated in FIG. 14 (e).

FIG. 14 (g) is a cross-sectional view illustrating a step in the another fabrication of the second conventional semiconductor device, which step is next to the step illustrated in FIG. 14 (f).

FIG. 14 (h) is a cross-sectional view illustrating a step in the another fabrication of the second conventional semiconductor device, which step is next to the step illustrated in FIG. 14 (g).

EXPLANATION OF REFERENTIAL NUMERALS

1. GLASS SUBSTRATE (SUBSTRATE)
3. LOWER ELECTRODE (Si)
4. INSULATING FILM (GI) (FIRST INSULATING FILM)
5. UPPER ELECTRODE (GE)
6. INTERLAYER INSULATING FILM (SECOND INSULATING FILM)
7. CONTACT HOLE
8. METAL WIRING (WIRING LAYER)
10. PIXEL AUXILIARY CAPACITOR
11. SOURCE METAL WIRING
12. GATE METAL WIRING (WIRING LAYER)
20. PIXEL TFT (PIXEL THIN FILM TRANSISTOR)

BEST MODE FOR CARRYING OUT THE INVENTION

Figure 1:
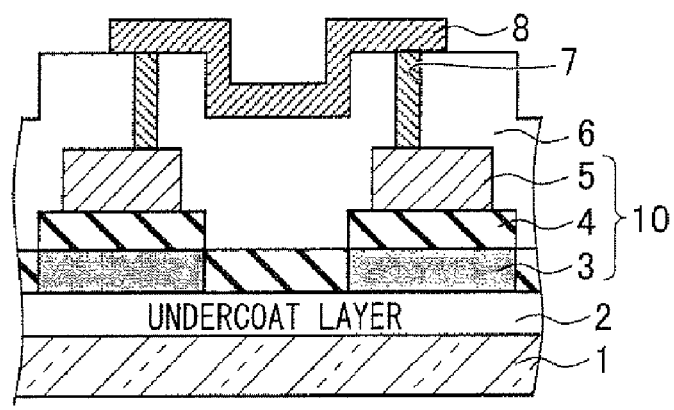
FIG. 1 (a) is a plane view of one embodiment of a liquid crystal display device of the present invention illustrating a peripheral circuit configuration on a liquid crystal panel substrate, the peripheral circuit configuration including a TFT and a pixel auxiliary capacitor.
Figure 1:
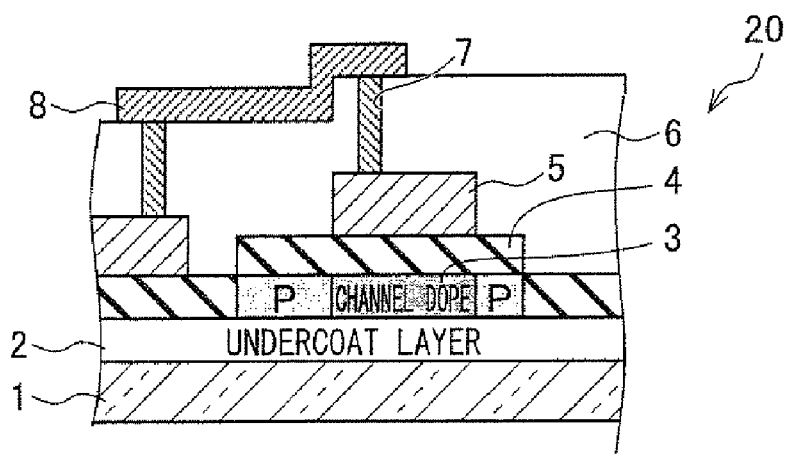

One embodiment of the present invention is described below referring to FIGS. 1 to 10. FIG. 1 (a) is a plane view illustrating a peripheral circuit configuration on a liquid crystal panel substrate. The peripheral circuit configuration includes a pixel auxiliary capacitor and a TFT (Thin Film Transistor). FIG. 1 (b) is a cross-sectional view taken from line A-A of FIG. 1 (a) illustrating a configuration of the pixel auxiliary capacitor on the liquid crystal panel substrate. FIG. 1 (c) is a cross-sectional view taken from line B-B of FIG. 1 (a) illustrating a configuration of the TFT on the liquid crystal panel substrate. FIG. 2 is a cross-sectional view taken from line C-C of FIG. 1 (a) illustrating the configuration of the TFT on the liquid crystal panel substrate.

As illustrated in FIGS. 1 (a) and 1 (b), in a liquid crystal display device of the present embodiment acting as a display device, an upper electrode (GE) S is entirely enclosed within an outline of a lower electrode (Si) 3. An insulating film (GI) 4, which acts as a first insulating film, is formed in between the lower electrode (Si) 3 and the upper electrode (GE) S. Although, in the explanation of this embodiment the display device is a liquid crystal display device, the present invention is also applicable to another display device, for example, a device that uses an emission element.

As illustrated in FIG. 1 (a), in the pixel auxiliary capacitor 10, a metal wiring 8, which is a wiring layer formed on the same level as a source metal wiring 11, is used as a wiring for connecting the upper electrode (GE) 5. In concrete terms, as illustrated in FIG. 1 (b), each upper electrode (GE) 5 is connected to each other through the contact hole 7 in the interlayer insulating film 6 (a first insulating layer) by the metal wiring 8 formed on the interlayer insulating film 6. The metal wiring 8 is formed on the same level as the source metal wiring 11 is formed.

It usually requires an additional forming step to connect the upper electrodes (GE) 5 to each other through the interlayer insulating film 6. However, in this embodiment, the metal wiring 8 is formed by a forming step of the source metal 11, which is conventionally provided. Thus it is not necessary to have an additional step for forming the metal wiring 8, whereby a fabrication cost does not increase.

Electric charge is conventionally accumulated over the whole part of the connected upper electrodes 5 (GE) by dry etching on the upper electrode 5 (GE) in a patterning process. However, in this embodiment, the forming steps of the upper electrode (GE) 5 and the metal wiring 8 is divided into two, thus electric charge is accumulated separately on each of the upper electrodes (GE) 5. Moreover, the electric charge accumulated on the upper electrode (GE) 5 is discharged in the process. Thus, in the present embodiment, the maximum electric charge amount accumulated on the upper electrodes (GE) 5 when each of the upper electrodes (GE) 5 is connected to each other is smaller than the electrical charge amount accumulated over the whole part of the conventional upper electrode (GE) 5. As a result, electrostatic discharge on the upper electrode 5 (GE) during manufacturing can be prevented. Moreover, if wet etching is used in an etching step for forming the same layer where the source metal wiring 11 is formed, an electric charge by plasma will not be easily accumulated on the wiring, thus electrostatic damage on circuit elements during the manufacturing will be more effectively prevented.

Meanwhile, as illustrated in FIG. 1 (c) and FIG. 2, in this embodiment, a pixel TFT 20 as the thin-film elements is a thin-film transistor with a top-gate N-type LDD structure. That is, the upper electrode (GE) 5 acts as a gate electrode, and the lower electrode (Si) 3 acts as a source electrode and a drain electrode. Also, in this embodiment, the N-type LDD structure is applied: there is a region for a source and a drain regions doped with N+ in high concentration as impurity. Moreover, in the vicinity of a channel between the source and drain regions, there is a Si layer region doped with or without N− in low concentration as impurity. As a result, changes in concentration distribution of impurity near the drain region become modulate, and electric intensity near the drain region decreases, whereby reliability improves.

Next, a fabrication method of a liquid crystal substrate comprising the pixel auxiliary capacitor 10 and the pixel TFT 20 in the above configurations is described below referring to FIGS. 3 (a) and 3 (b) to FIGS. 10 (a) and 10 (b). In each of figures, FIG. (a) illustrates the pixel auxiliary capacitor 10, and FIG. (b) illustrates the pixel TFT 20, which is simultaneously formed with the pixel auxiliary capacitor 10.

To begin with, as illustrated in FIGS. 3(a) and 3(b), pre-annealing and cleaning, as pre-processes, are performed on a glass substrate 1 where the pixel auxiliary capacitor 10 and the pixel TFT 20 are to be formed. Then, the following steps are performed:

(1) Forming Step of the Lower Electrode (Silicon (Si) Layer)

Figure 3:
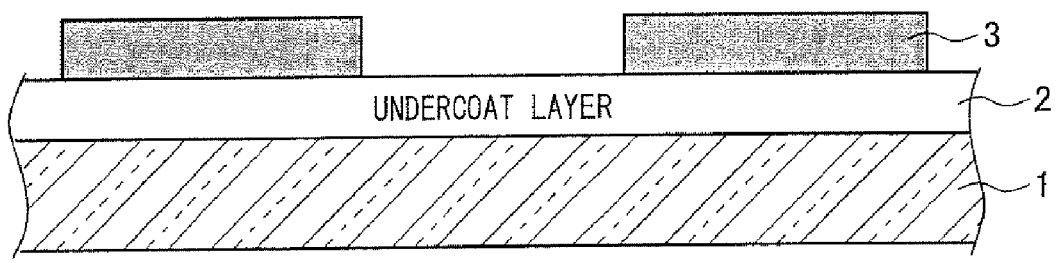
FIG. 3 (a) is a cross-sectional view illustrating a fabrication process of the liquid crystal display device.
Figure 3:
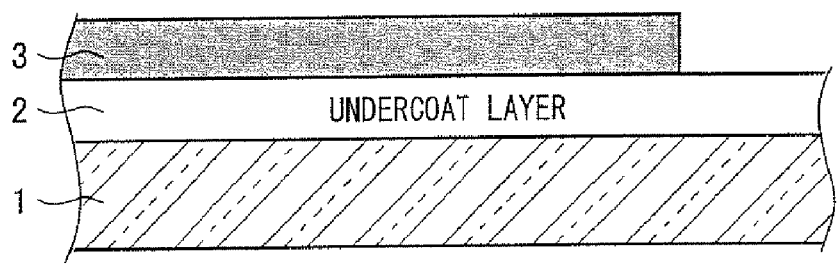

As illustrated in FIGS. 3 (a) and 3(b), an undercoat layer (TEOS/SiNO) 2 is formed on the glass substrate 1, then an amorphous silicon (a-Si) layer for the lower electrode (Si) 3 is formed on the undercoat layer (TEOS/SiNO) 2. The undercoat layer (TEOS/SiNO) 2 and amorphous silicon (a-Si) layer for the lower electrode (Si) 3 are formed by plasma enhanced chemical deposition (PECVD). Then crystallization is carried out by a solid-phase growth method (SPC)(heat treatment at about 600° C.). SiNX, SiON, $SiH_4+N_2O$, or other materials also may be used for forming the undercoat. In addition, it is possible to coat them with metal catalyst, as a pre-process for CG-siliconization before the solid-phase growth method (SPC) step.

Incidentally, if only the solid-phase growth method (SPC) was performed, this would give the pixel TFT 20 problems in terms of its properties such as low mobility and the like too small grains or due to big grains with a lot of deficit crystals in them.

To solve the above problem, laser annealing is performed next so as to enhance the quality of the crystal grains.

Lastly, the lower electrode (Si) 3 is formed in a desired shape by etching the silicon (Si) layer after patterning the silicon (Si) layer by photolithography.

(2) Forming Step of the Gate Insulating Film

Figure 4:
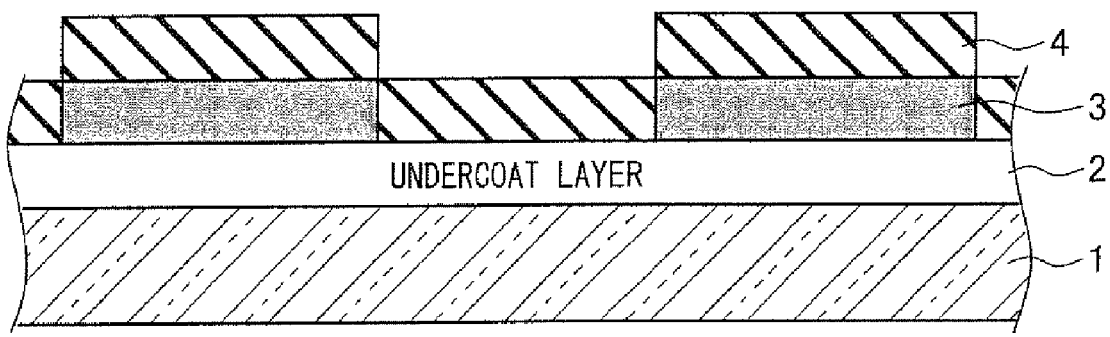
FIG. 4 (a) is a cross-sectional view illustrating the fabrication process of the liquid crystal display device.
Figure 4:
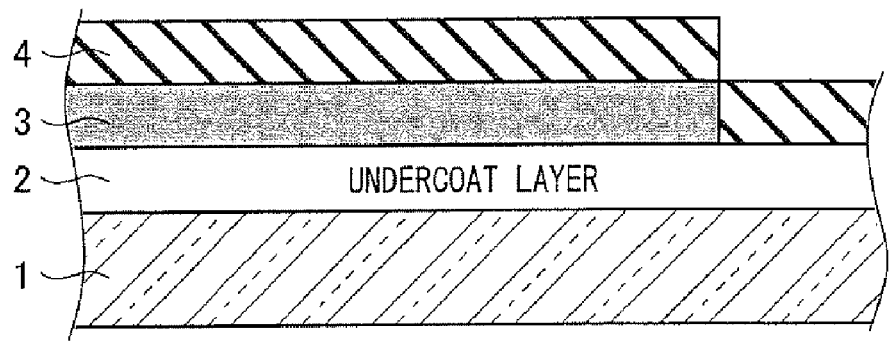

As illustrated in FIGS. 4 (a) and 4 (b), the insulating film (GI: Gate Insulator) 4 is formed by tetra ethyl ortho silicate (TEOS) gas. SiNx, SiON, $SiH_4+N_2O$, or other also may be used as a material for the insulating film (GI) 4.

(3) Channel Doping Step

Figure 5:
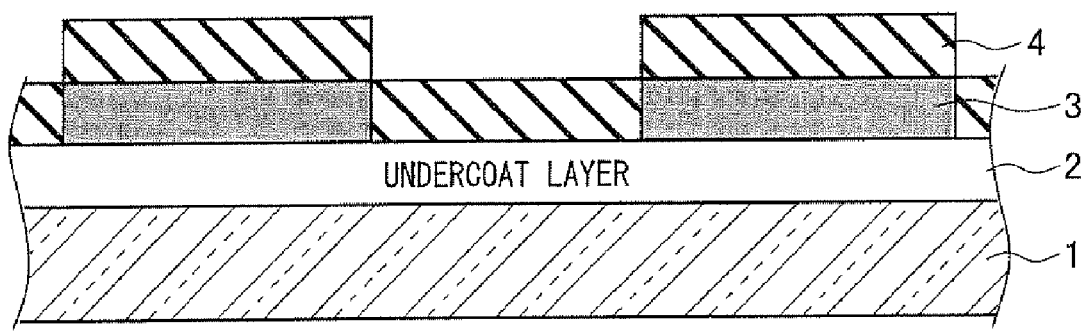
FIG. 5 (a) is a cross-sectional view illustrating the fabrication process of the liquid crystal display device.
Figure 5:
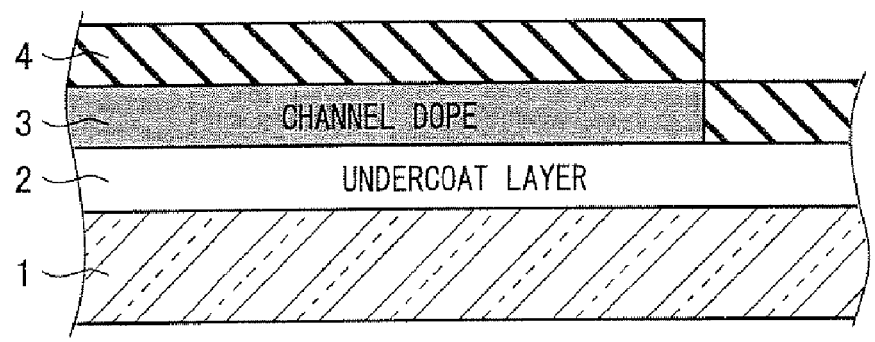

Then, as illustrated in FIGS. 5 (a) and 5 (b), boron is channel-doped in a predetermined quantity either over the entire substrate or in a desired area specified in a desired pattern by photolithography. The channel doping is necessary to control a threshold of the transistor, which is used to drive the pixel transistor and other circuits of the liquid crystal panel.

In case where a transistor requires an overlap structure, a predetermined quantity of phosphorous is doped in a pattern formed by photolithography as desired. This channel doping may be performed before forming the insulting film (GI) 4.

As illustrated in FIG. 5(a), the channel doping forms the lower electrode (Si) 3, which is electrically conductive, and made from a silicon (Si) layer in the pixel auxiliary capacitor 10.

(4) Forming Step of the Upper Electrode (GE: Gate Metal) 5

Then, as illustrated in FIG. 6 (a) and FIG. (b), a tungsten (W) film and a tantalum nitride (TaN) film are formed by spattering or other techniques. Low-resistance metals like MoW, Al, and high-melting point metals, which have smooth surface and stable properties, may be used for the gate metal.

Then, dry etching is performed by using an adjusted quantity of mixed gas made of Ar, $SF_6$, $CF_4$, $O_2$, $C_{12}$, and other gasses after a desired pattern is formed by photolithography. Thereby, the double-layered upper electrode (GE) 5 is formed.

(5) Forming Step of the Source and Drain Regions

Figure 7:
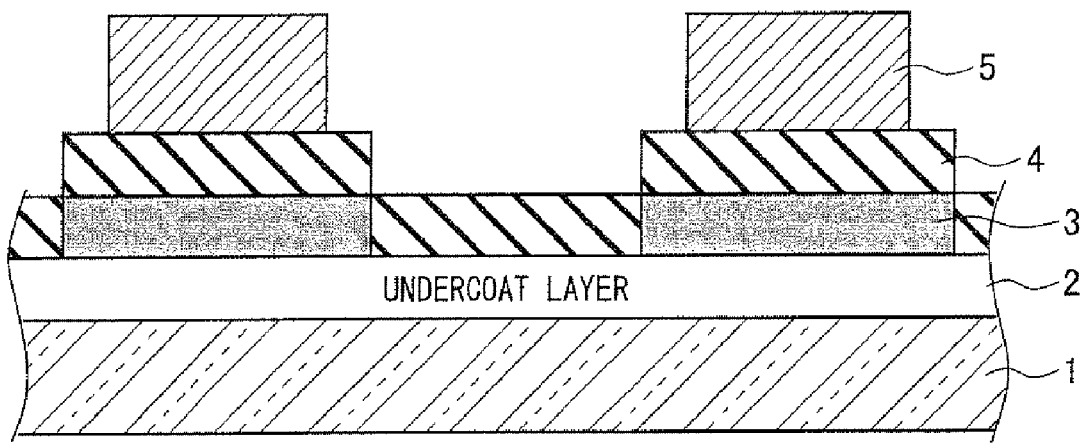
FIG. 7 (a) is a cross-sectional view illustrating the fabrication process of the liquid crystal display device.
Figure 7:
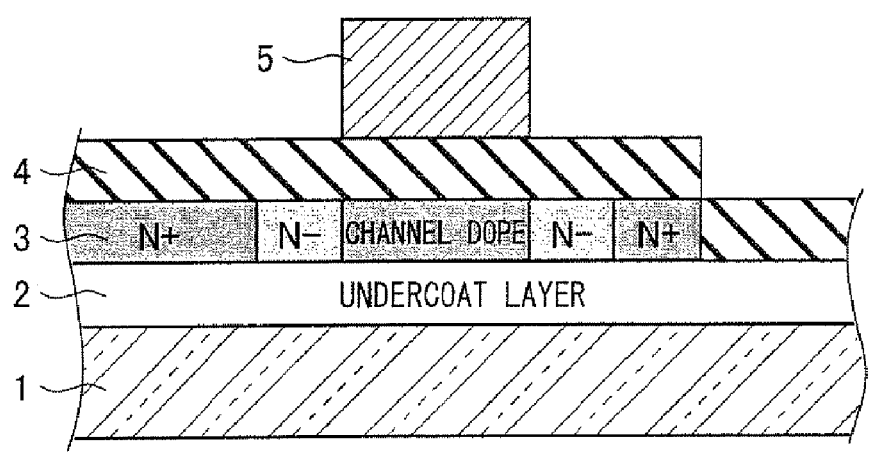

Then, as illustrated in FIG. 7 (a) and FIG. 7 (b), the source and drain regions for the transistor are formed in a desired pattern by photolithography. Then, phosphorous is doped in an N channel, and boron is doped in a P channel in the source and drain regions in the transistor. As illustrated in FIG. 7 (b), an LDD structure is formed in a desired pattern by photolithography if needed. When CG-silicon is used for the transistor, doping is simultaneously performed for forming a gettering site. Then, heat activation treatment is performed at about 600° C. to move the ions doped near the surface of a p—Si thin-film to a deeper inside of the p—Si layer and activate them. On the other hand, exposing an exima laser is another method for activating the ions. The activation treatments improve electric conductivity.

As a result of the above treatments, the lower electrode (Si) 3 becomes the conductive source and drain electrodes in the pixel TFT 20 illustrated in FIG. 7 (b).

(6) Forming Step of the Layer Insulating Film

Figure 8:
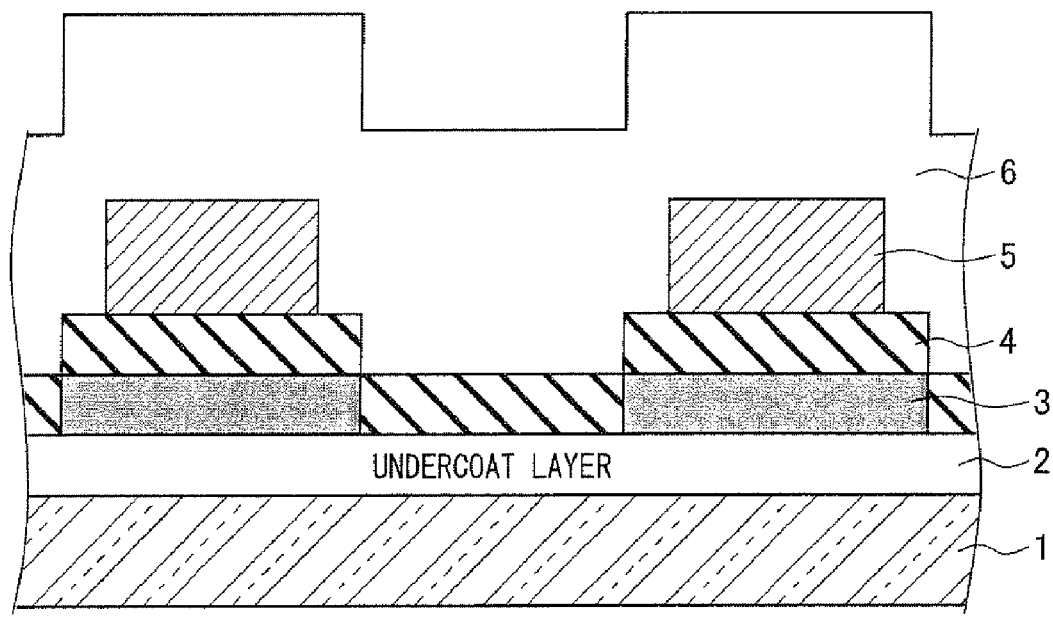
FIG. 8 (a) is a cross-sectional view illustrating the fabrication process of the liquid crystal display device.
Figure 8:
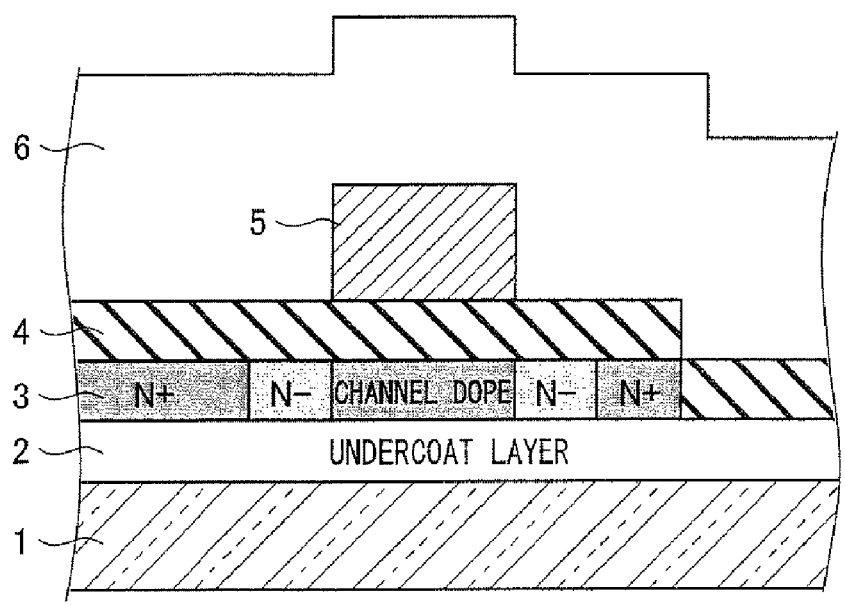

Then, as illustrated in FIGS. 8 (a) and 8 (b), the interlayer insulating film 6 is formed by a PECVD technique. SiNx, SiON, TEOS or other materials may also be used for forming the layer insulating film 6.

(7) Forming Step of a Contact Part

Figure 9:
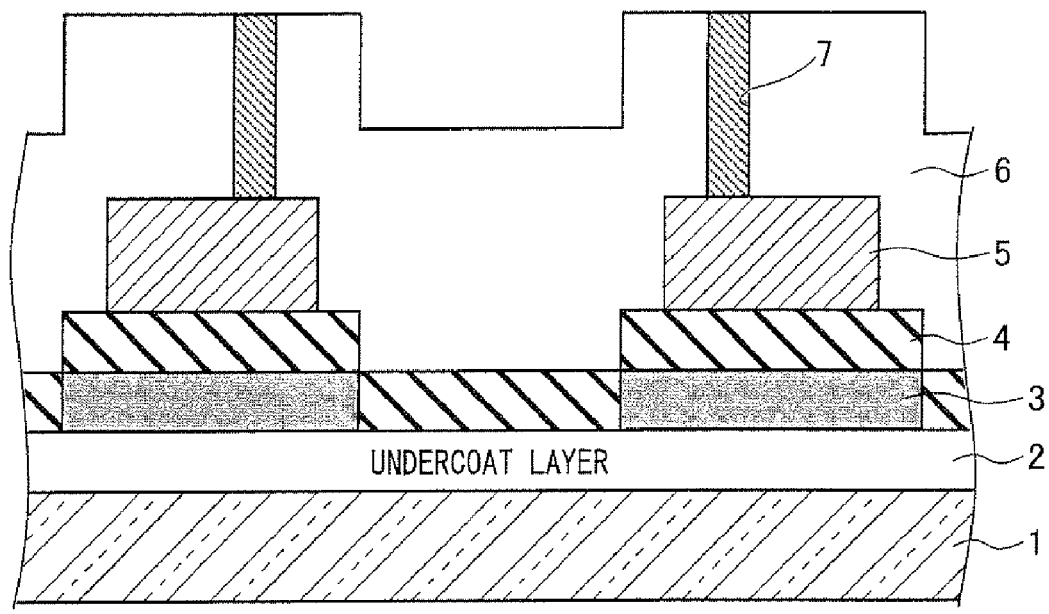
FIG. 9 (a) is a cross-sectional view illustrating the fabrication process of the liquid crystal display device.
Figure 9:
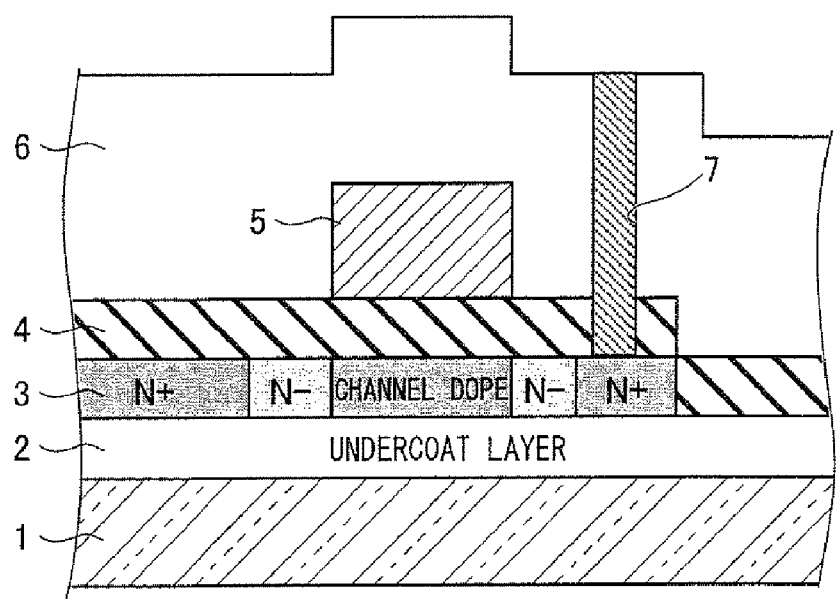

Next, as illustrated in FIGS. 9 and 9 (b), a contact hole 7 is formed by wet etching in a desired pattern with a hydrofluoric acid-type wet etching liquid after a desired pattern is formed by photolithography.

(8) Annealing Step

Furthermore, to improve the silicon (Si) quality, hydrogenated annealing treatment is performed at about 400° C.

(9) Forming Step of a Source Metal

Figure 10:
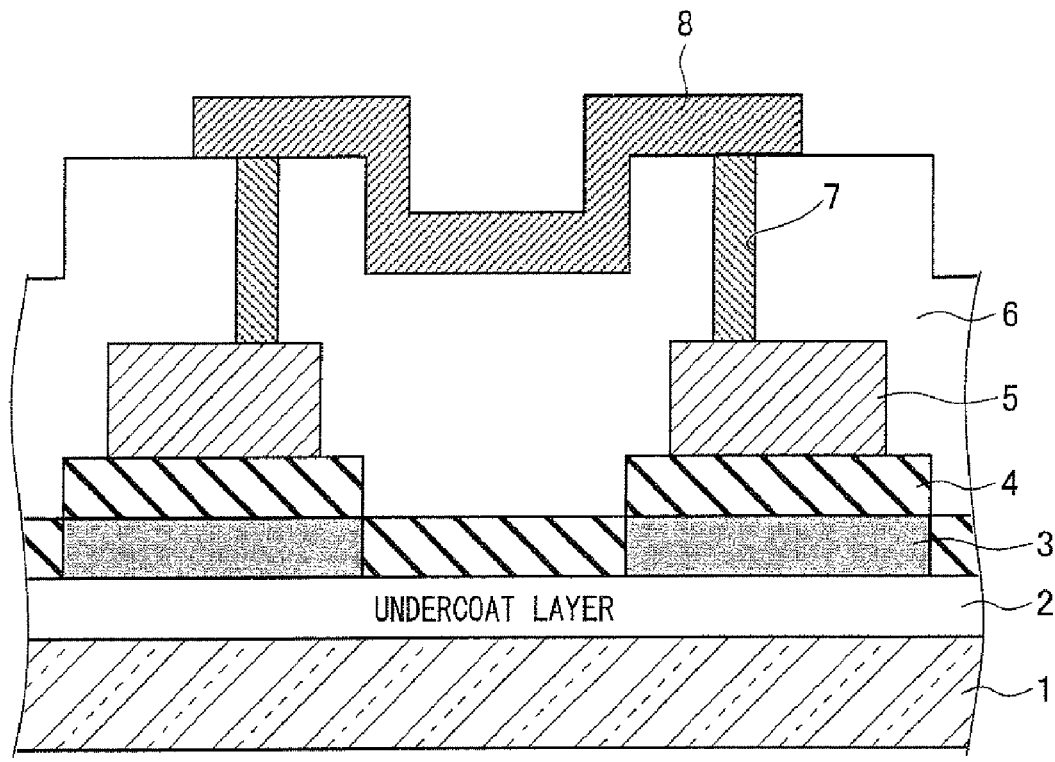
FIG. 10 (a) is a cross-sectional view illustrating the fabrication process of the liquid crystal display device.
Figure 10:
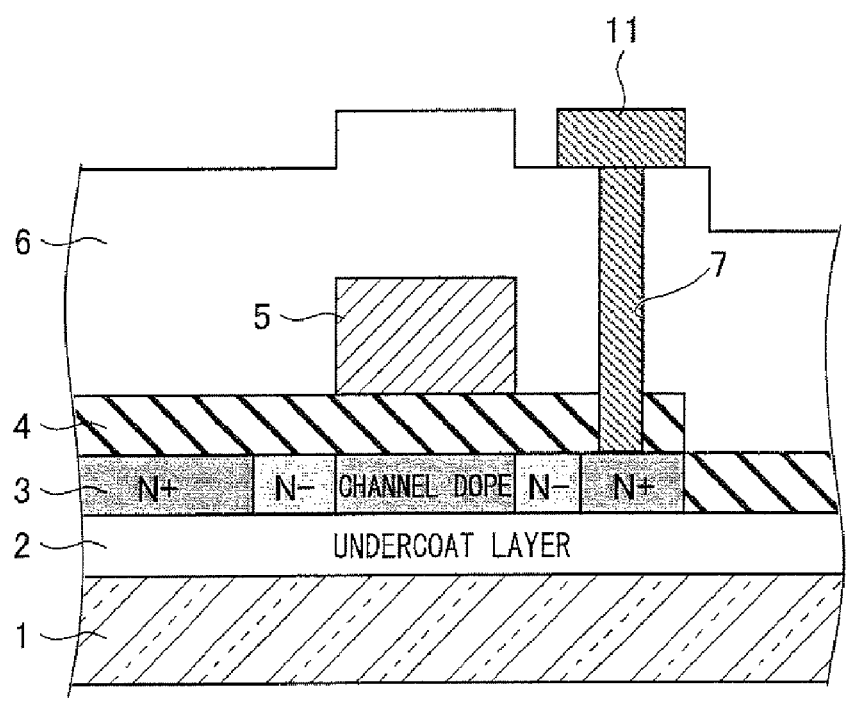
Figure 11:
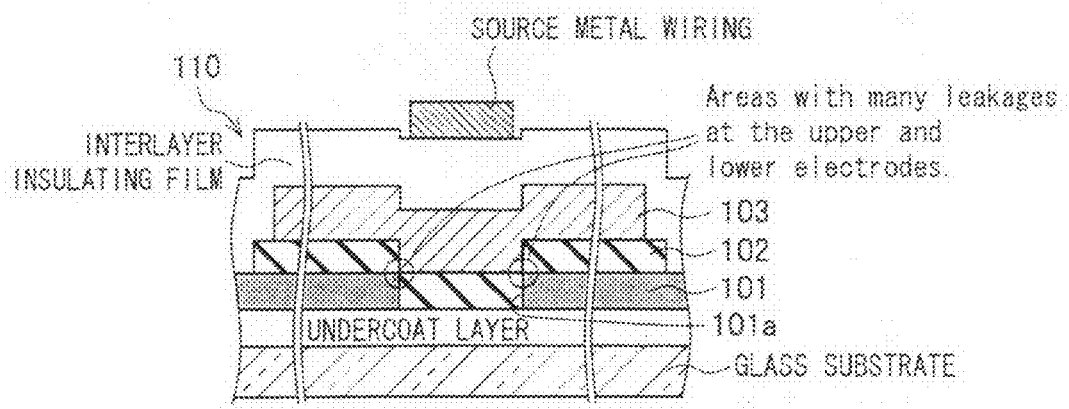
FIG. 11 (a) is a plane view of a conventional liquid crystal display device illustrating a peripheral circuit configuration on a liquid crystal panel substrate, the peripheral circuit configuration including a TFT and a pixel auxiliary capacitor.
Figure 11:
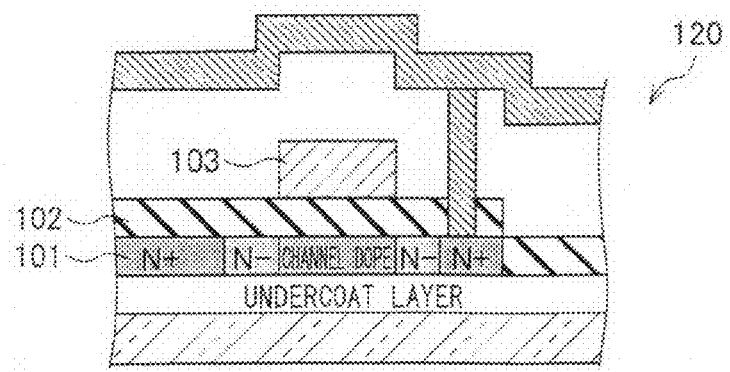
Figure 12:
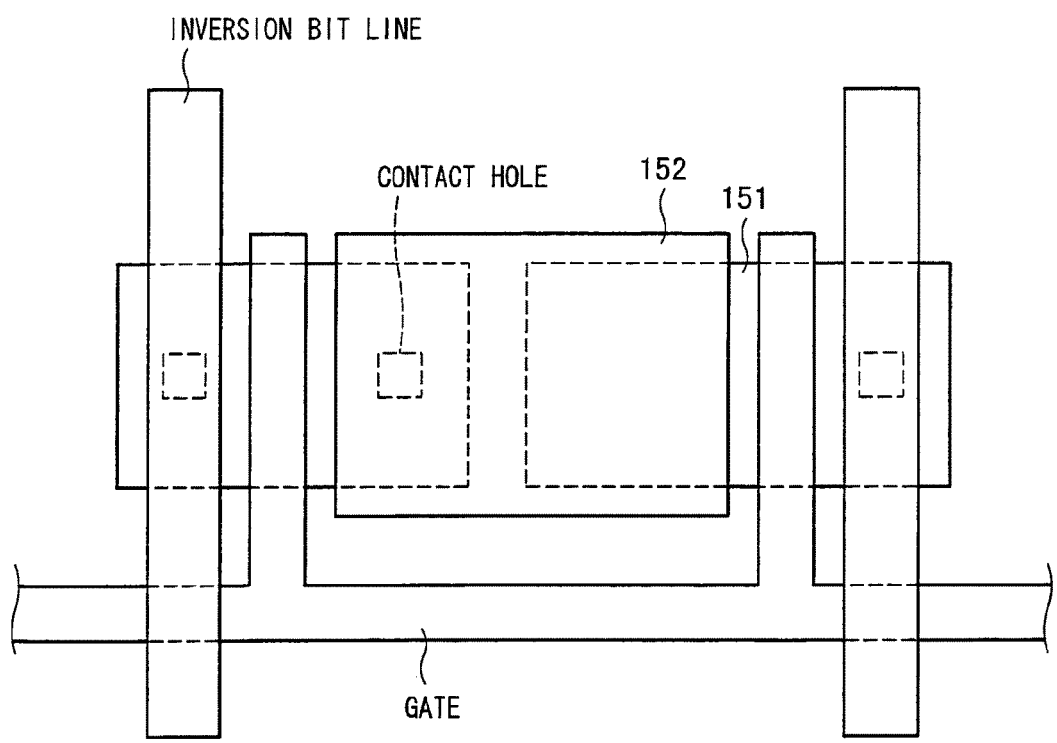
FIG. 12 is a plane view illustrating a configuration of a conventional memory cell.
Figure 14A:
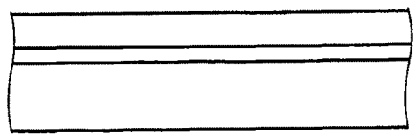
FIG. 14 (a) is a cross-sectional view illustrating a step in another fabrication of a conventional semiconductor device.
Figure 14B:
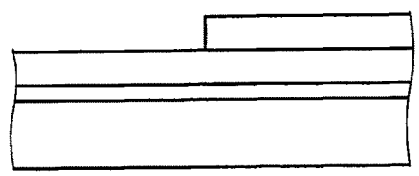
Figure 14C:
Figure 14D:
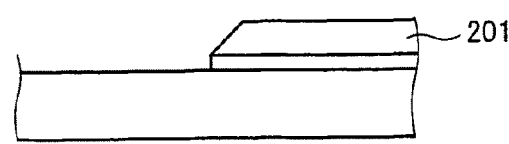
Figure 14E:
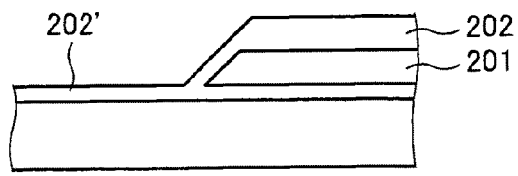
Figure 14F:
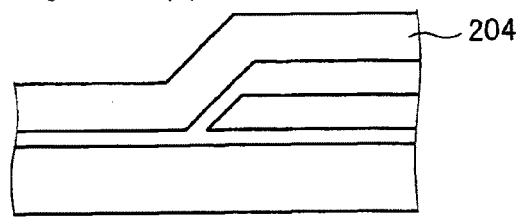
Figure 14G:
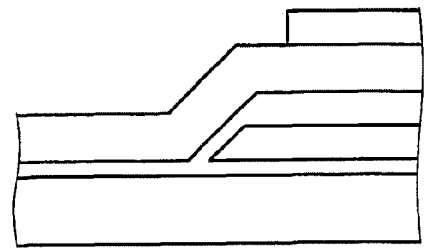
Figure 14H:
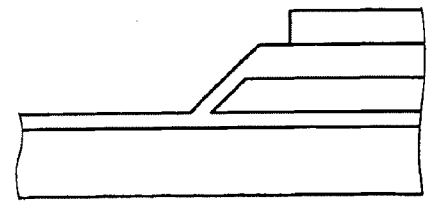

Then, as illustrated in FIGS. 10 (a) and 10 (b), metal thin films are formed with a titanium (Ti) film, an aluminum-silicon (Al—Si) system alloyed metal film, and a Ti film in this order by a spattering technique. Then, a source (drain) metal wiring 11 and a metal wiring 8 are formed by patterning in a desired pattern by photolithography and then dry etching in the desired pattern. As a result, in the pixel auxiliary capacitor 10 illustrated in FIG. 10 (a), the upper electrode (GE) 5 is electrically connected to the metal wiring 8 through the contact hole 7. At the same time, in the pixel TFT 20 illustrated in FIG. 10 (b), the source electrode in the lower electrode (Si) 3 is electrically connected to the source metal wiring 11 through the contact hole 7. In addition, although it is not illustrated in the figures, the upper electrode (GE) 5, which acts as the gate electrode, is connected to a gate metal wiring through the contact hole 7 in the pixel TFT 20.

After the source metal wiring 11 and the metal wiring 8 are formed, an interlayer insulating film as a protective film, which is not illustrated in figures, is formed on them by the PECVD technique. Then, a contact is formed by patterning in a desired pattern by photolithography and then etching in the desired pattern. Then, multi-gaps, rise-and-fall structure and a contact are formed by the steps of coating with resin, performing photolithography to form a desired pattern, and then etching. Thereby, the semi-transmissive multi-gap structure is formed. Then, a transparent electrode (ITO) and a reflective electrode are formed by patterning a material thereof in a desired pattern by photolithography and etching the material in the desired pattern. In this way, the fabrication on the array-side liquid crystal substrate is completed.

As explained above, in the pixel auxiliary capacitor 10 and pixel TFT 20 and their fabrication method of the present embodiment, each of the upper electrodes (GE) 5 respectively opposing to the corresponding lower electrode (Si) 3 is entirely enclosed within the outline of the lower electrode (Si) 3 in a plane view. As a result, the upper electrode (GE) 5 does not extend across the lower electrode (Si) 3, whereby the upper electrode (GE) 5 is not affected by the edge of the lower electrode (Si) 3. This prevents leakage (which is caused by exceeding the breakdown voltage) at the edge of the lower electrode (Si) 3. In addition, the thin-film elements can be used in the pixel TFT 20 without making a difference in a threshold property of the TFT.

Therefore, it is possible to provide the thin-film elements, which are not affected by the edge of the lower electrode (Si) 3, and a fabrication method thereof.

Moreover, in the pixel auxiliary capacitor 10 and the pixel TFT 20 of the present embodiment, it is possible to connect the upper electrode (GE) 5 to outside by using the metal wiring 8, which is connected to the contact hole in the interlayer insulating film 6, via the source metal wiring 11 and the gate metal wiring 12. Thereby, in the pixel auxiliary capacitor 10, it is possible to electrically connect the upper electrodes (GE) 5 with each other. In the pixel TFT 20, the upper electrode (GE) 5, which acts as a gate electrode, can be connected, for example, to the gate metal wiring 12, which acts as a gate wiring.

In addition, in the liquid crystal display device and its fabrication method according to the present embodiment, the pixel auxiliary capacitor 10 and/or pixel TFT 20 are used as a pixel auxiliary capacitor and/or a pixel thin-film transistor. Therefore, it is possible to provide the liquid crystal display device, which is not affected by the edge of the lower electrode (Si) 3, and its fabrication method.

In addition, in the liquid crystal display device of the present embodiment, the source metal wiring 11 acts as a wiring layer and can be formed by the conventional process, thereby it is not necessary to have an additional step.

Although, in the explanation of the present invention, the pixel auxiliary capacitor and the TFT (Thin Film Transistor: thin-film transistor) are mounted on a liquid crystal panel substrate in a liquid crystal display device, a data storing capacitor in a memory cell may have the configurations of the lower electrode (Si) 3, the insulating film (GI) 4, and the upper electrode 5 of the present invention. For example, the configuration may be applied to memory cells such as a pixel frame memory on which a DRAM circuit is integrated on a glass substrate.

Thus, it is possible to provide a memory cell, which is not affected by the edge of the lower electrode (Si) 3, and its fabrication method by using the thin-film elements as a data storing capacitor in the memory cell fabrication.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention is applicable to a plurality of thin-film elements each of which includes, on a substrate, a lower electrode, a first insulting layer, and an upper electrode. More specifically, the present invention is also applicable to a fabrication method of the thin-film elements. More specifically, the present invention is applicable to a pixel auxiliary capacitor and/or a pixel thin-film transistor in a display device. The invention is applicable to various display devices such as an active matrix type liquid crystal display device, an electrophoretic display, a twist ball type display, a reflection type display, which uses a microscopic prism film, and a digital mirror device, which uses light modulation elements, and the other display devices. Apart from them, the present invention is also applicable to display devices using light emitting elements which can emit light in variable brightness, such as an organic EL light emitting elements, an inorganic EL light emission elements, LED (Light Emitting Diode), a field emission display (FED) and a plasma display.

Also the present invention is applicable to memory cells such as pixel frame memories having a DRAM integrated on a glass substrate.

The invention claimed is:

1. A plurality of thin-film elements each comprising:
   a lower electrode, a first insulating layer, and an upper electrode in this order on a substrate, wherein:
   each upper electrode opposing to the corresponding lower electrode is entirely enclosed within an outline of the lower electrode in a plane view, so that any opening in the upper electrode corresponds to an opening in the lower electrode, and no opening in the lower electrode is covered by any portion of the upper electrode.

2. The thin-film elements as set forth in claim 1, comprising:
   a second insulating layer formed on the upper electrode; and
   a wiring layer formed on the second insulating layer,
   the upper electrode and the wiring layer being connected to each other electrically through a contact hole in the second insulating layer.

3. A display device wherein pixel auxiliary capacitors are thin-film elements, wherein: the thin-film elements each include:
   a lower electrode, a first insulating layer, and an upper electrode in this order on a substrate; and each upper electrode opposing to the corresponding lower electrode is entirely enclosed within an outline of the lower electrode in a plane view, so that any opening in the upper electrode corresponds to an opening in the lower electrode, and no opening in the lower electrode is covered by any portion of the upper electrode.

4. The display device as set forth in claim 3, wherein: each thin-film element includes:
   a second insulating layer formed on the upper electrode; and
   a wiring layer formed on the second insulating layer; and
   the upper electrode and the wiring layer are connected to each other electrically through a contact hole in the second insulating layer.

5. The display device as set forth in clam 4, wherein the wiring layer acts as a source wiring layer.

6. A display device comprising thin-film transistors which are thin-film elements, wherein:
   the thin-film elements, which are thin film transistors, each include a lower electrode, a first insulating layer, and an upper electrode in this order on a substrate, and each upper electrode opposing to the corresponding lower electrode is entirely enclosed within an outline of the lower electrode in a plane view.

7. The display device as set forth in claim 6, wherein: each thin-film element includes:
   a second insulating layer formed on the upper electrode; and
   a wiring layer formed on the second insulating layer; and
   the upper electrode and the wiring layer are connected to each other electrically through a contact hole in the second insulating layer.

8. The display device as set forth in claim 7, wherein the wiring layer acts as the source wiring layer.

9. A display device wherein pixel auxiliary capacitors and thin-film transistors are thin-film elements, wherein:
   the thin-film elements each include a lower electrode, a first insulating layer, and an upper electrode in this order on a substrate, and each upper electrode opposing to the corresponding lower electrode is entirely enclosed within an outline of the lower electrode in a plane view, so that any opening in the upper electrode corresponds to an opening in the lower electrode, and no opening in the lower electrode is covered by any portion of the upper electrode.

10. The display device as set forth in claim 9, wherein: each thin-film element includes:
    a second insulating layer formed on the upper electrode; and
    a wiring layer formed on the second insulating layer; and
    the upper electrode and the wiring layer are connected to each other electrically through a contact hole in the second insulating layer.

11. The display device as set forth in claim 10, wherein the wiring layer acts as the source wiring layer.

12. A memory cell wherein data storing capacitors are thin-film elements, wherein:
    the thin-film elements each includes a lower electrode, a first insulating layer, and an upper electrode in this order on a substrate, and each upper electrode opposing to the corresponding lower electrode is entirely enclosed within an outline of the lower electrode in a plane view, so that any opening in the upper electrode corresponds to an opening in the lower electrode, and no opening in the lower electrode is covered by any portion of the upper electrode.

13. The memory cell as set forth in claim 12, wherein: each thin-film element includes:
    a second insulating layer formed on the upper electrode; and
    a wiring layer formed on the second insulating layer,
    the upper electrode and the wiring being connected to each other electrically through a contact hole in the second insulating layer.

14. A fabrication method for fabricating a thin-film element, the method comprising:
    forming a lower electrode on a substrate;
    forming a first insulating layer on the lower electrode; and
    forming an upper electrode on the insulating layer, so that the upper electrode is enclosed within the outline of the lower electrode in a plane view, so that any opening in the upper electrode corresponds to an opening in the lower electrode, and no opening in the lower electrode is covered by any portion of the upper electrode.

15. The fabrication method as set forth in claim 14, comprising the steps of:
    forming a second insulating layer on the upper electrode;
    forming a contact hole in the second insulating layer; and
    forming on the second insulating layer a wiring layer electrically connected to the upper electrode through the contact hole.

16. A method for producing a display device, such that a fabrication method for fabricating a thin-film element is used for fabrication of a pixel auxiliary capacitor, the fabrication method for the thin-film element comprises:
    forming a lower electrode on a substrate;
    forming a first insulating layer on the lower electrode;
    forming an upper electrode on the first insulating layer, so that the upper electrode is enclosed within the outline of the lower electrode in a plane view, so that any opening in the upper electrode corresponds to an opening in the lower electrode, and no opening in the lower electrode is covered by any portion of the upper electrode.

17. The fabrication method as set forth in claim 16, wherein: the fabrication method for the thin-film element further includes the steps of;
    forming a second insulating layer on the upper electrode;
    forming a contact hole in the second insulating layer; and forming on the second insulating layer a wiring layer electrically connected to the upper electrode through the contact hole.

18. A method for producing a display device, the method being arranged such that a fabrication method for fabricating a thin-film element is used for fabrication of a thin film transistor, wherein: the fabrication method for the thin-film element includes the steps of:
forming a lower electrode on a substrate;
forming a first insulating layer on the lower electrode;
forming an upper electrode on the first insulating layer, so that the upper electrode is enclosed within the outline of the lower electrode in a plane view.

19. The fabrication method as set forth in claim 18, wherein: the fabrication method for the thin-film element further includes the steps of;
forming a second insulating layer on the upper electrode;
forming a contact hole in the second insulating layer; and
forming on the second insulating layer a wiring layer electrically connected to the upper electrode through the contact hole.

20. A method for producing a display device, the method being arranged such that a fabrication method for fabricating a thin-film element is used for fabrication of a pixel auxiliary capacitor and a thin film transistor, wherein: the fabrication method for the thin-film element includes the steps of:
forming a lower electrode on a substrate;
forming a first insulating layer on the lower electrode;
forming an upper electrode on the first insulating layer, so that the upper electrode is enclosed within the outline of the lower electrode in a plane view.

21. The fabrication method as set forth in claim 20, wherein: the fabrication method for the thin-film element further includes the steps of
forming a second insulating layer on the upper electrode;
forming a contact hole in the second insulating layer; and
forming on the second insulating layer a wiring layer electrically connected to the upper electrode through the contact hole.

22. A method for producing a memory cell, such that a fabrication method for fabricating a thin-film element is used for fabrication of a data storing capacitor, the fabrication method for the thin-film element comprising:
forming a lower electrode on a substrate;
forming a first insulating layer on the lower electrode;
forming an upper electrode on the first insulating layer, so that the upper electrode is enclosed within the outline of the lower electrode in a plane view, so that any opening in the upper electrode corresponds to an opening in the lower electrode, and no opening in the lower electrode is covered by any portion of the upper electrode.

23. The fabrication method as set forth in claim 22, wherein: the fabrication method for the thin-film element further includes the steps of;
forming a second insulating layer on the upper electrode;
forming a contact hole in the second insulating layer; and
forming on the second insulating layer a wiring layer electrically connected to the upper electrode through the contact hole.

24. A plurality of thin-film elements, which are thin film transistors, each comprising:
a lower electrode, a first insulating layer, and an upper electrode in this order on a substrate, so that the thin film transistors are supported by the substrate,
wherein each upper electrode opposing to the corresponding lower electrode is entirely enclosed within an outline of the lower electrode in a plane view.

* * * * *